(12) United States Patent
Vinet et al.

(10) Patent No.: US 9,570,465 B2
(45) Date of Patent: Feb. 14, 2017

(54) DUAL STI INTEGRATED CIRCUIT INCLUDING FDSOI TRANSISTORS AND METHOD FOR MANUFACTURING THE SAME

(71) Applicants: Commissariat a l'energie atomique et aux energies alternatives, Paris (FR); International Business Machines Corporation, Armonk, NY (US); STMicroelectronics, Inc., Coppell, TX (US)

(72) Inventors: Maud Vinet, Rives sur Fure (FR); Kangguo Cheng, Albany, NY (US); Bruce Doris, Slingerlands, NY (US); Laurent Grenouillet, Rives sur Fure (FR); Ali Khakifirooz, San Jose, CA (US); Yannick Le Tiec, Crolles (FR); Qing Liu, Guilderland, NY (US)

(73) Assignees: COMMISSARIAT A L'ENERGIE ATOMIQUE ET AUX ENERGIES ALTERNATIVES, Paris (FR); INTERNATIONAL BUSINESS MACHINES CORPORATION, Armonk, NY (US); STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 14/771,025

(22) PCT Filed: Feb. 28, 2013

(86) PCT No.: PCT/EP2013/054113
§ 371 (c)(1),
(2) Date: Aug. 27, 2015

(87) PCT Pub. No.: WO2014/131461
PCT Pub. Date: Sep. 4, 2014

(65) Prior Publication Data
US 2016/0013205 A1    Jan. 14, 2016

(51) Int. Cl.
*H01L 21/84*     (2006.01)
*H01L 27/12*     (2006.01)
(Continued)

(52) U.S. Cl.
CPC .......... *H01L 27/12* (2013.01); *H01L 21/762* (2013.01); *H01L 21/823878* (2013.01);
(Continued)

(58) Field of Classification Search
CPC .. H01L 21/84; H01L 29/0653; H01L 27/1203; H01L 29/0649; H01L 27/12; H01L 21/762
See application file for complete search history.

(56) References Cited

U.S. PATENT DOCUMENTS

| 2006/0043474 A1 | 3/2006 | Kinzer et al. | |
| 2007/0290293 A1* | 12/2007 | Trivedi | H01L 21/76224 257/506 |

(Continued)

FOREIGN PATENT DOCUMENTS

| FR | WO 2012160071 A1 * | 11/2012 | .......... H01L 27/1108 |
| WO | 2012 160071 | 11/2012 | |

OTHER PUBLICATIONS

International Search Report Issued Oct. 22, 2013 in PCT/EP2013/054113 Filed Feb. 28, 2013.

*Primary Examiner* — Jerome Jackson, Jr.
*Assistant Examiner* — Paul Budd
(74) *Attorney, Agent, or Firm* — Oblon, McClelland, Maier & Neustadt, L.L.P.

(57) ABSTRACT

An integrated circuit, including: a first cell, including: FDSOI transistors; a UTBOX layer lying beneath the transistors; a first well lying beneath the insulator layer and beneath the transistors, the first well having a first type of
(Continued)

doping; a first ground plane having a second type of doping, located beneath one of the transistors and between the insulator layer and the first well; a first STI separating the transistors and crossing the insulator layer; a first conductive element forming an electrical connection between the first well and the first ground plane, located under the first STI; a second cell including a second well; a second STI separating the cells, crossing the insulator layer and reaching the bottom of the first and second wells.

15 Claims, 5 Drawing Sheets

(51) Int. Cl.
*H01L 21/8238* (2006.01)
*H01L 21/762* (2006.01)
*H01L 29/06* (2006.01)

(52) U.S. Cl.
CPC .......... *H01L 21/84* (2013.01); *H01L 27/1203* (2013.01); *H01L 27/1207* (2013.01); *H01L 29/0649* (2013.01); *H01L 29/0653* (2013.01); *H01L 21/823892* (2013.01)

(56) References Cited

U.S. PATENT DOCUMENTS

| | | |
|---|---|---|
| 2010/0055856 A1 | 3/2010 | Hong et al. |
| 2012/0146147 A1 | 6/2012 | Hook |
| 2012/0256262 A1 | 10/2012 | Vinet et al. |
| 2012/0299080 A1 | 11/2012 | Dennard et al. |
| 2014/0077300 A1* | 3/2014 | Noel ............ H01L 27/1108 257/351 |

* cited by examiner

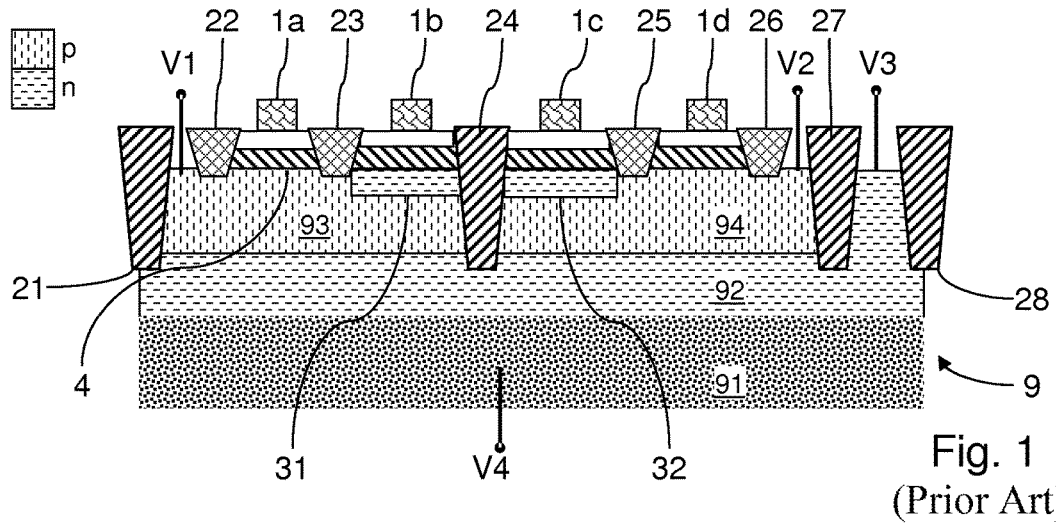
Fig. 1 (Prior Art)
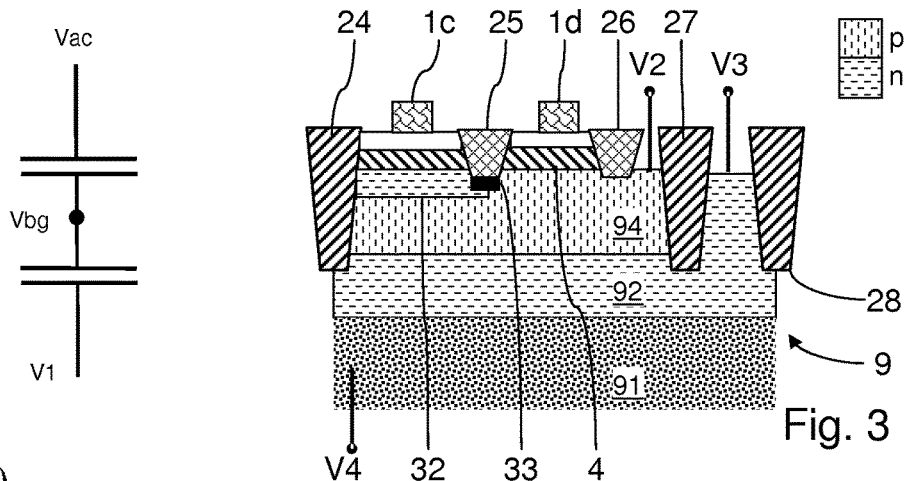
Fig. 3
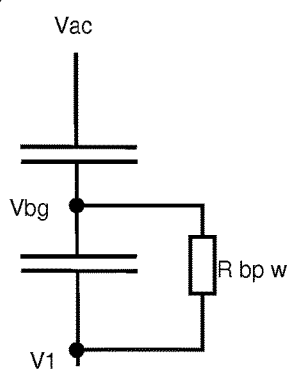
Fig. 2 (Prior Art)
Fig. 4

DUAL STI INTEGRATED CIRCUIT INCLUDING FDSOI TRANSISTORS AND METHOD FOR MANUFACTURING THE SAME

The present invention relates to semiconductor integrated circuits and, more specifically, integrated circuits manufactured on a SOI (Silicon on Insulator) substrate.

In SOI technology, a thin layer of silicon (typically featuring a thickness of a few nanometers) is separated from a semiconductor substrate by a relatively thick electrically insulating layer (typically featuring a thickness of a few tens of nanometers).

Integrated circuits in SOI technology offer a number of advantages compared to traditional "bulk" technology for CMOS (Complementary Metal Oxide Semiconductor) integrated circuits. SOI integrated circuits typically provide a lower power consumption for a same performance level. Such circuits also feature a reduced stray capacitance, allowing an increase of commutation speeds. Furthermore, the latch-up phenomena encountered in bulk technology can be mitigated. Such circuits are therefore particularly adapted to SoC (System on Chip) or MEMS (Micro electro-mechanical systems) applications. SOI circuits also are less sensitive to ionizing radiations, making them more reliable than bulk-technology circuits in applications where said radiations may induce operating problems, such as aerospace applications. SOI integrated circuits can include memory components such as SRAM (Static Random Access Memory), or logic gates.

Much research has been conducted on reducing the static power consumption of logic gates, while increasing their commutation speed. Some integrated circuits combine both logic gates with low power consumption, and logic gates with high commutation speed. In order to integrate two such logic gates on a same integrated circuit, it is known to lower the threshold voltage (typically noted $V_T$ or $V_{th}$) of some transistors belonging to the high-speed logic gates, and to increase the threshold voltage of some other transistors of the low-consumption logic gates. In bulk technology, threshold voltage modulation is implemented by differentiating the doping level of the semiconductor channel of these transistors. However, FDSOI (Fully Depleted Silicon On Insulator) transistors have, by design, a depleted channel, featuring a low doping level (typically $10^{15}$ cm$^{-3}$). Due to this low doping level, it is not possible to modulate the threshold voltage of transistors with the method used in bulk technology. Some studies have proposed integrating different gate materials in otherwise identical transistors, in order to obtain differing threshold voltages. However, implementing this solution is technically challenging and economically prohibitive.

In order to obtain different threshold voltages for transistors in FDSOI technology, it is also known to include an electrically biased ground plane (also named back plane, or back gate), located between a thin electrically insulating oxide layer, and the silicon substrate. This technology is often known as UTBOX (for Ultra-Thin Buried OXide layer). By adjusting the type of doping of, and the electrical bias applied to these ground planes, it is therefore possible to define several ranges of threshold voltages for said transistors. For example, it is possible to define low-threshold voltage transistors (LVT for Low Vt, typically between 300 mV and 400 mV), high-threshold voltage transistors (HVT for High Vt, typically above 450 mV preferentially 550 mV) and medium or standard threshold voltage transistors (SVT for Standard Vt, typically 450 mV).

There is a growing need for adjacent cells including transistors having different threshold voltages. FIG. 1 illustrates an example of a dual STI integrated circuit 9 including FDSOI (Fully Depleted Silicon On Insulator) transistors according to the prior art. Such a circuit is designed to allow an independent biasing for the ground planes of the cells and is also designed to provide the highest possible integration density.

The integrated circuit 9 includes FDSOI transistors 1a, 1b, 1c and 1d. Transistors 1a and 1b form a first cell, whereas transistors 1c and 1d form a second cell. These transistors are located on an ultra-thin buried oxide (UT-BOX) insulator layer 4. In order to provide an electrical isolation between transistors:

- transistor 1a is located between an isolation trench 22 and an isolation trench 23;
- transistor 1b is located between an isolation trench 23 and an isolation trench 24;
- transistor 1c is located between an isolation trench 24 and an isolation trench 25;
- transistor 1d is located between an isolation trench 25 and an isolation trench 26.

A semiconductor well 93 lies below the UTBOX layer 4, under the transistors 1a and 1b. A semiconductor well 94 lies below the UTBOX layer 4, under the transistors 1c and 1d. The semiconductor wells 93 and 94 have a p-type doping. A ground plane 31 (also named back gate or back gate) lies beneath transistor 1b. The upper surface of ground plane 31 is contacting the UTBOX layer 4 while its lower surface contacts the well 93. The upper part of well 93 constitutes a ground plane under transistor 1a. A ground plane 32 lies beneath transistor 1c. The upper surface of ground plane 32 is contacting the UTBOX layer 4 while its lower surface contacts the well 94. The upper part of well 94 constitutes a ground plane under transistor 1d. Ground planes 31 and 32 have an n-type doping. A p-type substrate 91 is separated from wells 93 and 94 by a deep n-well 92.

A V1 biasing is applied on well 93. A V2 biasing is applied on well 94. A V3 biasing is applied on deep n-well 92. A V4 biasing is applied on substrate 91. To avoid additional biasing contacts, the ground plane 31 is biased through well 93 and the ground plane 32 is biased through well 94. Thus, short shallow trench isolations 22 and 23 are used to guarantee a semiconductor continuity between the V1 bias contact, the well 93 and the ground plane 31. Similarly, short shallow trench isolations 25 and 26 are used to guarantee a semiconductor continuity between the V2 bias contact, the well 94 and the ground plane 32. These short shallow trench isolations do not reach the bottom of wells 93 and 94.

With different V1 and V2 bias voltages, to avoid a leakage current between wells 93 and 94, a deep isolation trench 24 is located between transistors 1b and 1c and between wells 93 and 94. This deep isolation trench reaches the bottom of wells 93 and 94. The deep trench 24 protrudes inside the deep n-well 92. Deep isolation trenches 21, 27 and 28 extending to the same depth as trench 24 are also provided.

Due to the use of two different depths for the isolation trenches, such an integrated circuit is commonly named dual STI. Wells 93 and 94 can be biased independently and good integration density can be obtained.

However, such an integrated circuit suffers from a major drawback. During the manufacturing process of the integrated circuit 9, wells 93 and 94 are commonly created by ionic implantation inside the deep n-well 92. Ground planes 31 and 32 are then created by ionic implantation inside wells 93 and 94 respectively. Due to the good control of the ionic implantation process, the interface between a ground plane and its well is very accurate. After the ionic implantation, the integrated circuit undergoes an annealing process, which improves the quality of the interface between a ground plane and its well. Such an accurate interface provides several advantages. However, such an interface induces a capacitive coupling between the ground plane and its well.

A corresponding equivalent electric circuit is illustrated at FIG. 2. The ground plane has a voltage Vbg. A capacitance is created by the UTBOX layer 4 (Vac voltage) between the ground plane and the transistor located above. The diode formed by the ground plane and the well (at voltage V1) induces a parasitic capacitance as disclosed previously. In practice, this parasitic capacitance induces a delay for the biasing of the ground plane by the well. This delay may reach approximately one second, which is far too much for transistors having switching frequencies higher than several hundreds of MHz.

Thus, there is a need for an integrated circuit having an optimal integration density, providing a reduced biasing delay between wells and ground planes, and having a minimum incidence on the manufacturing process.

The invention relates to an integrated circuit, including:
a first cell, comprising:
first and second FDSOI field effect transistors;
a UTBOX type insulator layer lying beneath said first and second transistors;
a first semiconductor well lying beneath the insulator layer and beneath said first and second transistors, said first semiconductor well having a first type of doping;
a first semiconductor ground plane having a second type of doping different from the first type, said first semiconductor ground plane being located beneath said first transistor and between the insulator layer and the first semiconductor well;
a first shallow trench isolation separating said first and second transistors and crossing said insulator layer without reaching the bottom of the first well;
a first conductive element forming an electrical connection between the first well and the first ground plane, said first conductive element being located under said first shallow trench isolation;
a second cell including a second semiconductor well;
a second shallow trench isolation separating said first and second cells, crossing said insulator layer and reaching the bottom of said first and second wells.

In another embodiment, the integrated circuit further comprises a biasing circuit programmed to apply simultaneously different biasing voltages on said first and second semiconductor wells.

In another embodiment, said first ground plane is deprived of any biasing contact crossing the insulator layer above said first ground plane.

In another embodiment, the circuit further comprises:
a semiconductor substrate located under said first and second wells and having the first type of doping;
a semiconductor deep well separating the substrate from the first and second wells and having the second type of doping.

In another embodiment, said first and second shallow trench isolations comprise a layer of nitride on at least one of their sidewalls.

In another embodiment, a portion of the conductive element is located beneath one of said nitride layers.

In another embodiment, the conductive element includes one of the following impurity materials with a density at least ten times higher than the density of this impurity material in the first ground plane or in the first well: Ar, N, C, Se, S, Al, Cu, Ag, Ni, Pt, Co, Ti, W or Au.

In another embodiment, the integrated circuit further comprises a second conductive element forming an electrical connection between the first well and the first ground plane, and wherein the second shallow trench isolation comprises:
an upper portion overlapping at least one part of the second conductive element;
a lower portion extending deeper than said second conductive element.

In another embodiment, said first conductive element has a thickness comprised between 5 and 50 nm.

The invention also relates to a method for manufacturing an integrated circuit, comprising the steps of:
providing a stack including a semiconductor substrate, a UTBOX type insulator layer lying above said semiconductor substrate and a semiconductor layer lying above said insulator layer;
forming a first groove in said stack, the first groove reaching the semiconductor substrate;
forming a second groove in said stack, the second groove extending in the semiconductor substrate beyond said first groove;
forming a conductive element at the bottom of first groove;
filling said first and second grooves with insulation material to form first and second shallow trench isolations respectively;
doping a portion of the semiconductor substrate to form first and second wells on opposite sides of said second shallow trench isolation, said first and second wells having a first type of doping, said first well contacting said conductive element and extending on opposite sides of said first shallow trench isolation and extending deeper than the bottom of the first shallow trench isolation, and said second shallow trench isolation extending deeper than the bottom of the formed first and second wells;
doping an upper portion of said first well between said first and second shallow trench isolations to form a ground plane under said insulator layer, the formed ground plane contacting the conductive element and having a second type of doping different from the first type.

In another embodiment, said step of forming a conductive element includes a step of ionic implantation in the bottom of the first groove.

In another embodiment, said ionic implantation includes the implantation of one of the following impurity materials: Ar, N, C, Se, S, As, In, Ge.

In another embodiment, said step of forming a conductive element includes a step of depositing metal at the bottom of the first groove and a step of reacting the metal deposit to form a metal silicide at the bottom of the first groove.

In another embodiment, the method further comprises a step of forming a layer of nitride on at least one sidewall of said first and second grooves.

In another embodiment, the method further comprises the steps of forming first and second FDSOI field effect transistors separated by said first shallow trench isolation, the respective source, drain and channel of each of these transistors being formed in said semiconductor layer.

The advantage of the present invention will become apparent from the following description of several embodiments with reference to the accompanying drawings, in which:

FIG. 1 is a schematic cross-section view of a prior art integrated circuit of the dual STI type;

FIG. 2 is an electric circuit representing the equivalent connections between elements of the integrated circuit of FIG. 1;

FIG. 3 is a schematic cross-section view of an integrated circuit of the dual STI type, according to an embodiment of the invention;

FIG. 4 is an electric circuit representing the equivalent connections between elements of the integrated circuit of FIG. 3;

Figure 5:
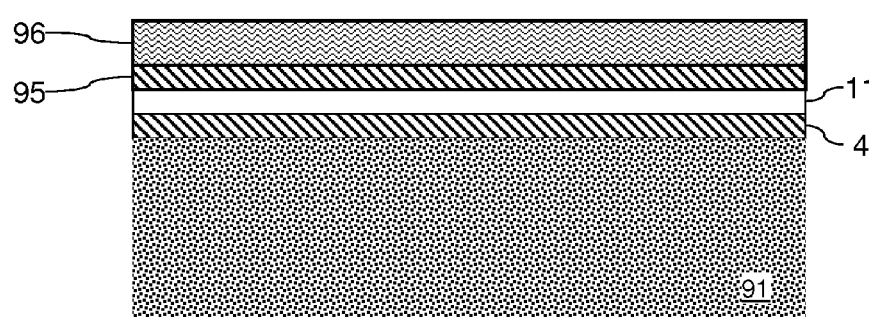
FIGS. 5 to 16 are schematic cross-section views of an integrated circuit according to embodiments of the invention, at different steps of their manufacturing process.

According to the invention, a conductive path is created between a ground plane and its well, in an integrated circuit including FDSOI transistors and of Dual-STI type. Thus, an electric circuit such as illustrated at FIG. 4 can be obtained. The conductive path between the ground plane and its well is illustrated by resistance Rbpw. The biasing delay between a ground plane and its well is thus significantly reduced.

FIG. 3 is a schematic cross-section view of a portion of an integrated circuit 9 according to an embodiment of the invention. The integrated circuit 9 includes FDSOI transistors 1c and 1d (either of the nMOS or pMOS types). The transistors 1c and 1d include respective gate stacks and respective active semiconductor layers (typically a silicon layer). Each active semiconductor layer includes a source, a channel and a drain. A gate oxide layer covers the channel. Said gate oxide layer is covered by a gate stack comprising metal layers and polysilicon layers. These stacks are usually laterally delimited by spacers.

The source and drain of the active semiconductor layer are doped with impurities. As known in FDSOI technology, the channel has a very low doping level so as to be in a depleted state. For example, the doping concentration of the channel is lower than $10^{16}$ cm$^{-3}$.

The transistors 1c and 1d are located on an ultra-thin buried oxide (UTBOX) insulator layer 4. The oxide layer 4 lies below the active semiconductor layer of the transistors 1c and 1d and provides an electrical insulation between this semiconductor layer and a silicon substrate 91. The substrate 91 has typically a p-type doping with a doping level lower than $10^{16}$ cm$^{-3}$ and, preferentially, lower than $5*10^{16}$ cm$^{-3}$. In the so-called UTBOX technology, the oxide layer 4 has a reduced thickness. For example, the thickness of the oxide layer 4 is comprised between 10 nm and 100 nm and, preferably, comprised between 10 nm and 50 nm. With a UTBOX layer, it is possible to adjust the threshold voltages of the transistors by using appropriate ground planes.

A semiconductor well 94 lies below the UTBOX layer 4, under the transistors 1c and 1d. The semiconductor well 94 has a p-type doping. A ground plane 32 lies beneath transistor 1c. The well 94 has preferentially a doping level comprised between $10^{16}$ and $10^{19}$ cm$^{-3}$. The well 94 may extend to a depth of up to 150 nm or 350 nm below the UTBOX layer 4.

The upper surface of ground plane 32 is contacting the UTBOX layer 4 while its lower surface contacts the well 94. The upper part of well 94 constitutes a ground plane under transistor 1d. The upper part of well 94 (corresponding to the ground plane) has preferentially a doping level comprised between $10^{18}$ and $5*10^{18}$ cm$^{-3}$. The lower part of well 94 has preferentially a doping level comprised between $5*10^{16}$ and $5*10^{17}$. Ground plane 32 has an n-type doping. The p-type substrate 91 is separated from well 94 by a deep well 92 of the n-type.

A V2 biasing is applied on well 94. A V3 biasing is applied on deep n-well 92. A V4 biasing is applied on substrate 91. To avoid additional biasing contacts and obtain an optimal integration density, the ground plane 32 is biased through well 94. Thus, short shallow trench isolations (SSTI) 25 and 26 are used to guarantee a semiconductor continuity between the V2 bias contact, the well 94 and the ground plane 32. These short shallow trench isolations SSTI 25 and 26 do not reach the bottom of well 94. The ground plane 32 extends underneath the SSTIs 25 and 26. Direct contact biasing contacts for ground plane 32 are thus not necessary, which allows a higher density of integration.

To provide an electrical isolation for transistors 1c and 1d:
transistor 1c is located between an isolation trench 24 and an isolation trench 25;
transistor 1d is located between an isolation trench 25 and an isolation trench 26.

The portion of the integrated circuit 9 illustrated at FIG. 3 only shows one cell. Such a circuit is designed to allow an independent biasing for the ground planes of adjacent cells not illustrated therein. The integrated circuit 9 thus includes deeper shallow trench isolations 24 and 27 located at the periphery of the illustrated cell.

A conductive pad 33 is located at an interface between the ground plane 32 and the well 94. The conductive pad 33 is located under the isolation trench 25. The conductive pad 33 contacts both the ground plane 32 and the well 94. The conductive pad 33 provides a much higher electrical conductivity or generation/recombination current than the direct interface between the ground plane 32 and the well 94. Due to the conductive pad 33, a direct conduction path is created between the ground plane 32 and the well 94. Thereby, the biasing delay of the ground plane 32 with respect to the well 94 is significantly reduced. As detailed afterwards, this improvement can be obtained without requesting major changes in the manufacturing process. This improvement is notably obtained without altering the properties of the channel of the FDSOI transistors.

Examples of manufacturing methods will now be disclosed. At FIG. 5, a p-type substrate 91 is provided. Substrate 91 is covered by a UTBOX layer 4. The UTBOX layer has typically a thickness between 10 and 50 nm. The UTBOX layer 4 is for instance a silicon oxide layer. The UTBOX layer 4 is covered by a semiconductor layer 11 (Typically a silicon layer having a thickness between 5 and 15 nm). Semiconductor layer 11 is typically covered by a pad oxide 95 (typically silicon oxide with a thickness between 3 and 15 nm) and a pad nitride 96 (typically silicon nitride with a thickness between 50 and 250 nm). The manufacturing method of this stack of layers is known per se from the prior art. Pad oxide 95 and pad nitride 96 may be replaced by one or more layers made out of different materials.

Figure 6:
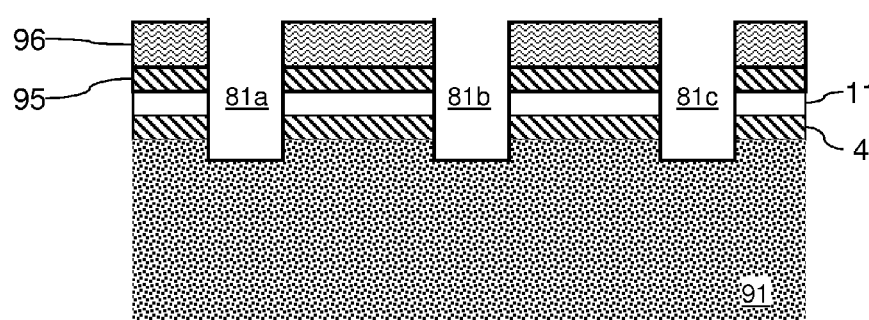

At FIG. 6, grooves 81a, 81b and 81c are formed through pad nitride 96, pad oxide 95, semiconductor layer 11 and UTBOX layer 4. The formed grooves 81a, 81b and 81c are deep enough to reach the substrate 91. These grooves can be formed by an active area photolithography process, including patterning and etching steps. According to this example, grooves 81a, 81b and 81c are advantageously formed simultaneously and have the same depth after this step.

Figure 7:
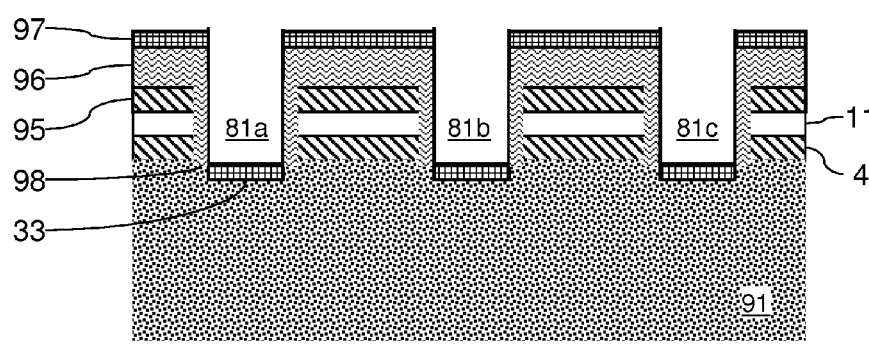
Figure 8:
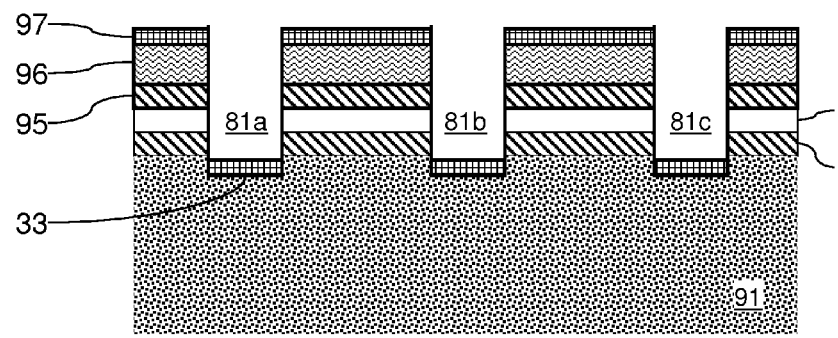

In an example illustrated at FIG. 7, spacers 98 are formed on the sidewalls of the grooves 81a, 81b and 81c. These spacers 98 may be formed out of silicon nitride. These spacers 98 protect the edges of UTBOX layer 4 and semiconductor layer 11 for the next steps of the process. In another example illustrated at FIG. 8, no spacers are formed on the sidewalls of the grooves 81a, 81b and 81c.

Conductive elements 33 are then created at the bottom of grooves 81a, 81b and 81c, in the substrate 91. Conductive elements 33 are made for instance by creating defect zones. Defect zones are created by inserting impurities into a silicon structure, whose implantation into the silicon structure cannot be healed by annealing. Thus, conductive elements 33 remain even after later steps of well and ground plane creation for instance.

According to the defect zone manufacturing process chosen, defect zones 97 are also created on the upper surface of pad nitride 96. The semiconductor layer 11 is protected by pad nitride 96 and pad oxide 95. Thus, whatever the process used to create defect zones for the conductive elements 33, this process does not introduce impurities in the semiconductor layer 11 or the UTBOX layer 4. Thus, channels of the FDSOI transistors to be formed will not be altered.

The conductive elements 33 will advantageously have a thickness comprised between 5 and 50 nm. The conductive elements 33 will preferentially extend up to the lower interface between the ground plane 32 and the well 94 in order to have a large defective surface located at the junction.

Amongst the possible methods for creating conductive elements 33 as defect zones, the following methods may be used:
  ionic implantation;
  plasma doping;
  metallic deposit.

Conformal doping or non-conformal doping methods may be used.

For ionic implantation and plasma doping, either inert species (like Ar, N or C) or defective species (like Se, As, In, Ge or S) can be used to create defect zones at the bottom of grooves 81a, 81b and 81c. For ionic implantation and plasma doping, the conductive element 33 is a semi-conductor from a chemical point of view but it behaves like a conductive element.

For ionic implantation, the following energy levels can be used: between 1 and 20 keV, preferentially from 1 to 5 keV for As. Typically, the implantation energy will be adapted to locate the peak of the implanted species at the interface between the ground plane and the well. This energy will vary depending on the molecular weight and can be determined for instance by using software distributed under the name TRIM by Mr Ziegler. The doping levels in the conductive elements 33 are preferentially comprised between $10^{13}$ at·cm$^{-2}$ and $10^{16}$ at·cm$^{-2}$ preferentially between $5*10^{14}$ at·cm$^{-2}$ and $5*10^{15}$ at·cm$^{-2}$. In case ionic implantation is used to create the conductive elements 33, pad nitride 96 is used as a shield and the upper surface of pad nitride 96 undergoes a ionic implantation forming defect zones 97 therein. Thus, the conductive elements 33 may be created with a wide range of doping density or implantation energy without altering UTBOX layer 4 or semiconductor layer 11.

Metal deposits may be used to create the conductive zones by a salicidation process. Metal deposits of Ni, Pt, Co, Ag, Al, Cu, Ti, W or Au may be deposited for instance preferentially Ni or Pt or an alloy made out of Ni and Pt for its compatibility with a CMOS process. W is interesting because of its tolerance to high temperature annealing. After a metal deposit, a salicide zone may be created by at least an annealing step and an etching step. These steps may be repeated. A metal salicide is eventually formed to provide a conductive element 33 at the bottom of grooves 81a, 81b and 81c. The creation of a metal salicide in a semiconductor layer is known per se by someone ordinary skilled in the art.

Since the conductive elements 33 are created at an early stage, before the shallow trench isolations are formed, the UTBOX layer 4 and the semiconductor layer 11 are protected by upper layers. In the embodiment illustrated, layers 4 and 11 are protected by pad nitride 96 and pad oxide 95, whatever the method chosen for creating the conductive elements 33.

Figure 9:
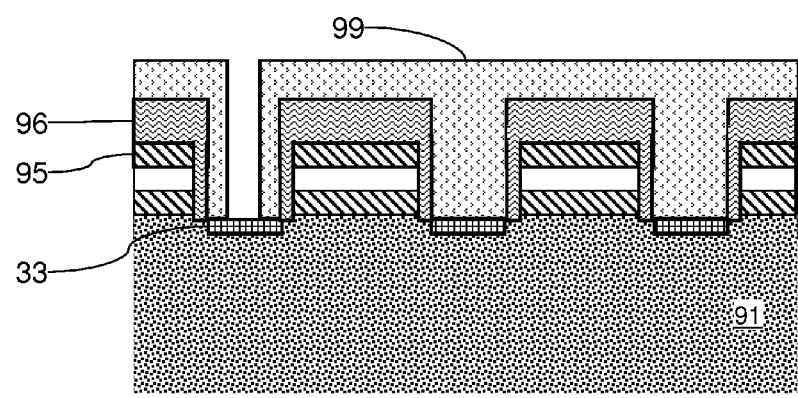

At FIG. 9, a mask 99 is patterned, for instance by photolithography. The mask 99 defines openings at locations where deeper shallow trench isolations are to be created. Thus, groove 81a is only partly filled by mask 99, whereas grooves 81b and 81c are fully filled by mask 99. Advantageously, groove 81a is at least partly masked, in order to mask part of a conductive element 33 with mask 99.

Figure 10:
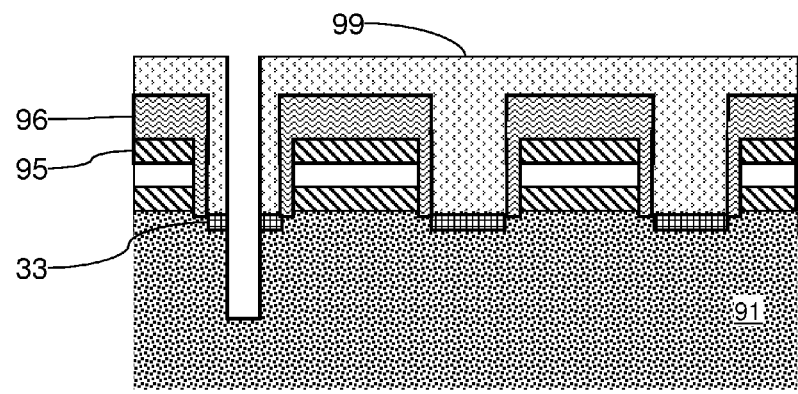
Figure 11:
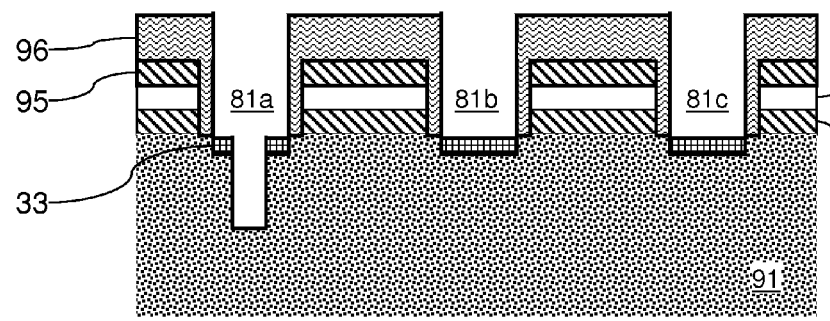

At FIG. 10, an etching step is performed. The median part of groove 81a is thereby etched. A deeper groove is thereby created through the conductive element 33 located at the bottom of groove 81a. The deeper groove extends into substrate 91. The depth of this deeper groove may reach for instance between 200 and 400 nm in substrate 91. At FIG. 11, the mask 99 is removed by a process known per se. Grooves 81a, 81b and 81c are thus emptied.

Figure 12:
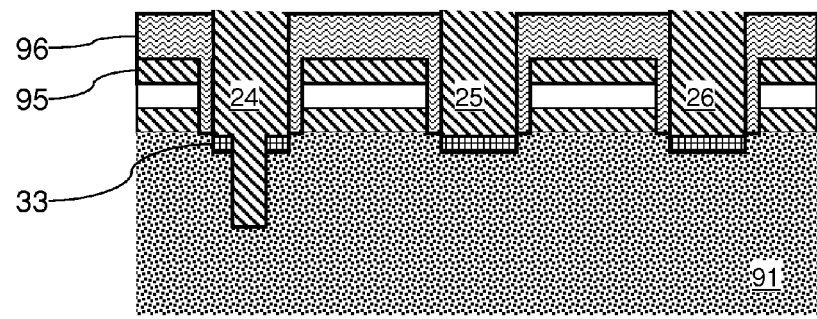

At FIG. 12, grooves 81a, 81b and 81c are filled with an appropriate isolation material. The isolation material may for instance be silicon oxide. A chemical mechanical polishing may be performed. These steps are known per se. Shallow trench isolations 24, 25 and 26 are obtained: a deeper STI 24 and shallower STIs 25 and 26. The conductive elements 33 are covered by respective shallow trench isolations.

The deeper STI 24 provides an upper portion and a lower portion. The upper and lower portions are linked at the level of the corresponding conductive element 33. In this embodiment, since mask 99 covered part of the corresponding conductive element 33 before the etching of the deeper groove, this covered part of the conductive element 33 remains beneath the upper portion of STI 24.

Figure 13:
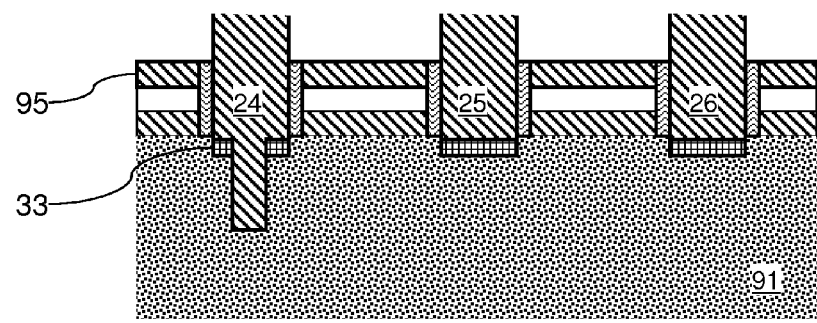

At FIG. 13, the pad nitride layer 96 is removed. The height of the protruding portions of STIs 24, 25 and 26 may be adjusted.

Figure 14:
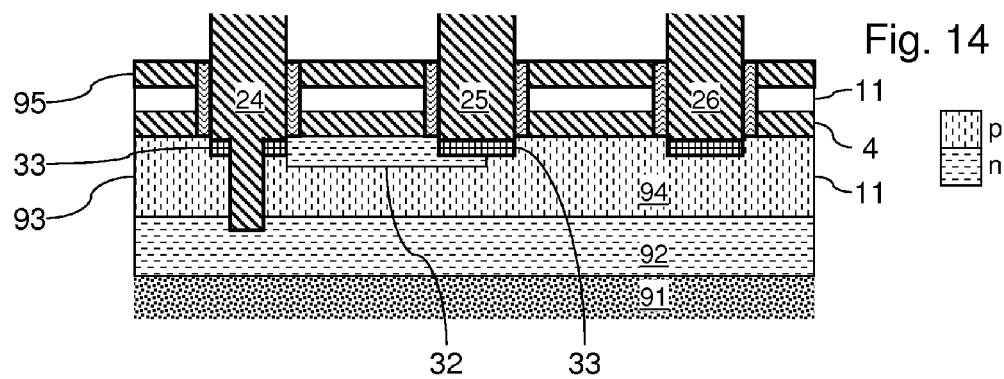

At FIG. 14, a deep nWell 92 is formed in substrate 91. P-doped wells 93 and 94 are formed above deep nwell 92, on respective sides of STI 24. Wells 93 and 94 do not reach the bottom of STI 24 and are thereby separated. Well 94 contacts the conductive elements 33 located under STI 25 and under the upper portion of STI 24. STI 24 extends into deep nWell 92. N-doped ground plane 32 is formed under UTBOX layer 4, between STIs 24 and 25. Ground plane 32 is formed between well 94 and UTBOX layer 4. In this embodiment, ground plane 32 contacts the UTBOX layer 4. Ground plane 32 contacts the conductive elements 33 located under STI 25 and under the upper portion of STI 24. Thus, these conductive elements 33 form an electrical connection between ground plane 32 and well 94. Ground plane 32, wells 93 and 94 and deep nWell 92 may be formed by an appropriate ionic implantation, with appropriate energy levels, impurity materials and implantation densities.

Due to the conductive elements 33 contacting both wells 94 and ground plane 32, the biasing delay between ground plane 32 and well 94 can be significantly reduced. An electrical behavior such as illustrated at FIG. 4 can thus be obtained.

Figure 15:
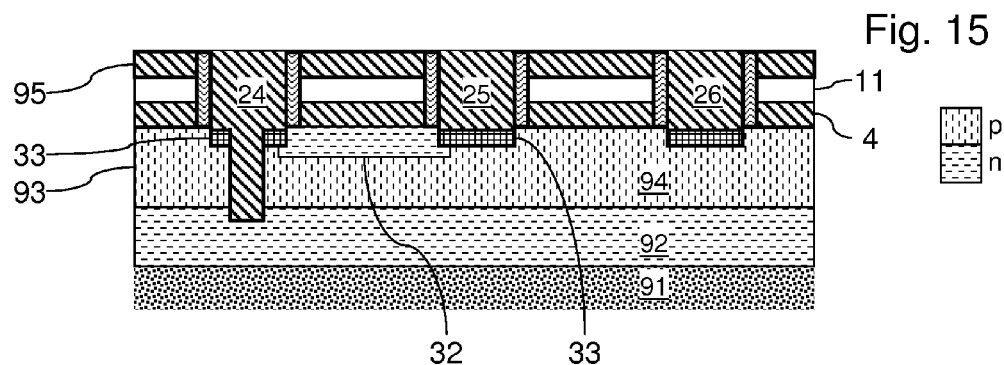
Figure 16:
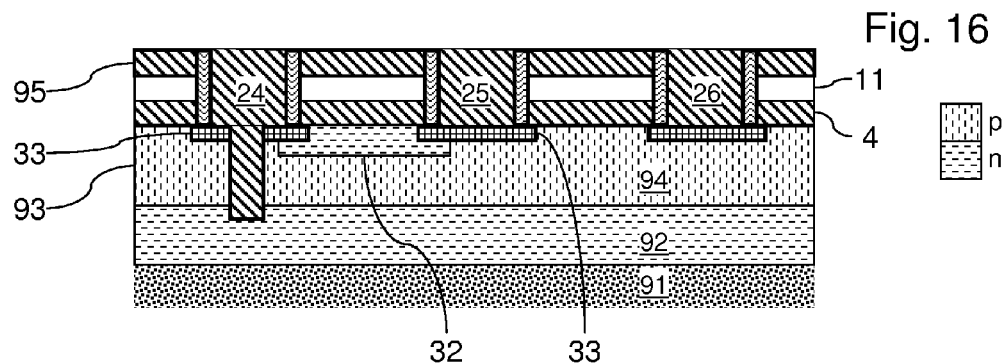

FIG. 16 shows an integrated circuit 9 according to another embodiment, at the same step of the manufacturing process as FIG. 15. In this embodiment, the conductive elements 33 are extending laterally beyond STIs 24, 25 and 26, beneath the UTBOX layer 4 and the semiconductor layer 11. Thus, portions of the conductive elements 33 remain even in case an etching step is performed on the bottom of grooves 81a, 81b and 81c.

In case the lower part of the deeper STI 24 is almost as wide as the upper part, portions of the conductive element 33 remain on the sidewalls of groove 81a even after the etching step of the lower part of this groove. Such a configuration can be obtained for instance by an appropriate ionic implantation of the conductive elements 33 into substrate 91.

In the previous embodiments, the short shallow trench isolations 25 and 26 have the same width as the deeper STI 24. However, the integrated circuit 9 may be designed with a deeper STI 24 wider than the short shallow trench isolations 25 and 26, with a deeper STI 24 having a lithographic width larger than the SSTI. Indeed the etching is self aligned and as a consequence the deeper STI 24 will actually have the same width as the SSTIs 25 and 26. The defective area will then be located on the side of the deeper STI.

The invention claimed is:

1. An integrated circuit, comprising:
    a first cell, comprising:
        first and second fully-depleted silicon-on-insulator (FDSOI) field effect transistors;
        an ultra-thin buried oxide (UTBOX) type insulator layer lying beneath the first and second transistors;
        a first semiconductor well lying beneath the insulator layer and beneath the first and second transistors, the first semiconductor well having a first type of doping;
        a first semiconductor ground plane having a second type of doping different from the first type, the first semiconductor ground plane being located beneath the first transistor and between the insulator layer and the first semiconductor well;
        a first shallow trench isolation separating the first and second transistors and crossing the insulator layer without reaching a bottom of the first well; and
        a first electrically conductive pad disposed under the first shallow trench isolation and between the first well and the first ground plane, the pad being an electrical connection between the first well and the first ground plane in addition to that of a direct interface between the first well and the first ground plane;
    a second cell including a second semiconductor well; and
    a second shallow trench isolation separating the first and second cells, crossing the insulator layer and reaching the bottom of the first well and a bottom of the second well.

2. The integrated circuit according to claim 1, further comprising a biasing circuit programmed to apply simultaneously different biasing voltages to the first and second semiconductor wells.

3. The integrated circuit according to claim 1, wherein the first ground plane is deprived of any biasing contact crossing the insulator layer above the first ground plane.

4. The integrated circuit according to claim 1, further comprising:
    a semiconductor substrate located under the first and second wells and having the first type of doping; and
    a semiconductor deep well separating the substrate from the first and second wells and having the second type of doping.

5. The integrated circuit according to claim 1, wherein the first and second shallow trench isolations comprise a layer of nitride on at least one sidewall of the first and second shallow trench isolations.

6. The integrated circuit according to claim 5, wherein a portion of the first conductive pad is located beneath one of the nitride layers.

7. The integrated circuit according to claim 1, wherein the first electrically conductive pad includes an impurity material of the following impurity materials with a density at least ten times higher than a density of the impurity material in the first ground plane or in the first well: Ar, N, C, Se, S, Al, Cu, Ag, Ni, Pt, Co, Ti, W, or Au.

8. The integrated circuit according to claim 1, further comprising a second electrically conductive pad being an electrical connection between the first well and the first ground plane, and wherein the second shallow trench isolation comprises:
    an upper portion overlapping at least one part of the second electrically conductive pad; and
    a lower portion extending deeper than the second electrically conductive pad.

9. The integrated circuit according to claim 1, wherein the first electrically conductive pad has a thickness between 5 nm and 50 nm.

10. A method for manufacturing an integrated circuit, comprising:
    providing a stack including a semiconductor substrate, an ultra-thin buried oxide (UTBOX) type insulator layer lying above the semiconductor substrate and a semiconductor layer lying above the insulator layer;
    forming a first groove in the stack, the first groove reaching the semiconductor substrate;
    forming a second groove in the stack, the second groove extending in the semiconductor substrate beyond the first groove;
    forming a conductive element at a bottom of first groove;
    filling the first and second grooves with insulation material to form first and second shallow trench isolations, respectively;
    doping a portion of the semiconductor substrate to form first and second wells on opposite sides of the second shallow trench isolation, the first and second wells having a first type of doping, the first well contacting the conductive element and extending on opposite sides of the first shallow trench isolation and extending deeper than a bottom of the first shallow trench isolation, and the second shallow trench isolation extending deeper than a bottom of the formed first well and a bottom of the formed second well; and
    doping an upper portion of the first well between the first and second shallow trench isolations to form a ground plane under the insulator layer, the formed ground plane contacting the conductive element and having a second type of doping different from the first type.

11. The method according to claim 10, wherein the forming the conductive element includes ionic implantation in the bottom of the first groove.

12. The method according to claim 11, wherein the ionic implantation includes implantation of an impurity material of the following impurity materials: Ar, N, C, Se, S, As, In, or Ge.

13. The method according to claim 10, wherein the forming the conductive element includes depositing metal at the bottom of the first groove and reacting the metal deposit to form a metal silicide at the bottom of the first groove.

14. The method according to claim 10, further comprising forming a layer of nitride on at least one sidewall of the first and second grooves.

15. The method according to claim 10, further comprising forming first and second fully-depleted silicon-on-insulator (FDSOI) field effect transistors separated by the first shallow trench isolation, and respective source, drain, and channel of each of the transistors being formed in the semiconductor layer.

* * * * *